United States Patent [19]

Winkler

[11] 3,770,890

[45] Nov. 6, 1973

[54] ELECTRONIC SWITCH FOR AN OPERATIONAL AMPLIFIER CIRCUIT

[75] Inventor: Richard H. Winkler, Palo Alto, Calif.

[73] Assignee: Spectrotherm Corp., Santa Clara, Calif.

[22] Filed: Mar. 6, 1972

[21] Appl. No.: 232,034

[52] U.S. Cl. .................................. 178/7.6, 318/640

[51] Int. Cl. .......................... H04n 3/00, G05b 1/06

[58] Field of Search ........................ 178/7.6, 69.5 F; 318/640, 318, 314, 446, 467, 471, 472, 473, 480

[56] References Cited

UNITED STATES PATENTS

| | | | |
|---|---|---|---|
| 3,500,151 | 3/1970 | Burk | 318/640 |
| 3,546,468 | 12/1970 | Takahashi | 178/7.6 |
| 3,495,036 | 2/1970 | Clayton | 178/7.6 |
| 3,626,091 | 12/1971 | Casper | 178/7.6 |

*Primary Examiner*—Gareth D. Shaw
*Attorney*—Karl A. Limbach et al.

[57] ABSTRACT

A technique for controllably supplying current from an operational amplifier to a load wherein the output circuit of the amplifier is connected to ground through a semiconductor switch. The current drawn by amplifier in response to its input signal when its output is connected to ground is then sensed and amplified for driving the load. When the amplifier output circuit is ungrounded by opening the semiconductor switch, the amplifier draws substantially no current and thus current to the load is shut off. An electronic circuit provides a delayed control of the semiconductor switch in the output of the operational amplifier.

10 Claims, 6 Drawing Figures

PATENTED NOV 6 1973 3,770,890

SHEET 1 OF 3

ELECTRONIC SWITCH FOR AN OPERATIONAL AMPLIFIER CIRCUIT

BACKGROUND OF THE INVENTION

The present invention relates generally to load control techniques and more specifically to a method and apparatus for indirectly switching load current.

It is an object of the present invention to provide an improved technique for controlling load current from an operational amplifier wherein the amplifier output is taken from current in its power supply lines.

It is another object of the present invention to provide an improved electronic delay circuit.

SUMMARY OF THE INVENTION

Briefly, the present invention includes the use of an operational amplifier for supplying current to a load through a voltage drop in each of its supply lines while the output of the operational amplifier is controllably connected to a fixed potential such as ground. When the amplifier output is disconnected completely from its fixed potential point, current to the load is interrupted since the operational amplifier requires very little or no current from its supply lines. Therefore, this technique provides a convenient means of load control. A semiconductor switch, such as an FET device, is preferably placed in the output line of the operational amplifier to turn the load current on and off by controlling the state of the semiconductor device state.

In one application of such a load controlling circuit, it is desired to turn on current to the load with a time delay after power is first turned onto the circuit, while shutting off load current immediately without any time delay after the power is removed from the circuit. This is accomplished by an electronic switch which drives a semiconductor device in the output line of the load driving operational amplifier. In its preferred form, this electronic switch utilizes a resistor-capacitor network wherein the voltage across the capacitor is monitored as a controlling variable. When the power is first initiated, a large resistor in series with the capacitor provides for charging the capacitor rather slowly and when the voltage thereacross reaches a certain predetermined level, the output of the load driving operational amplifier is grounded and current is thus provided to the load. When the power is shut off, however, a semiconductor switch places a low resistance across the capacitor to rapidly discharge it and thus to shut off the semiconductor device in the output line of the load driving operational amplifier which discontinues load current without any delay.

For additional details of the circuit techniques of the present invention, reference should be had to the following detailed description of a specific application thereof to an optical scanner when taken in conjunction with the accompanying drawings.

DESCRIPTION OF THE PREFERRED EMBODIMENTS

Figures 1, 1A:
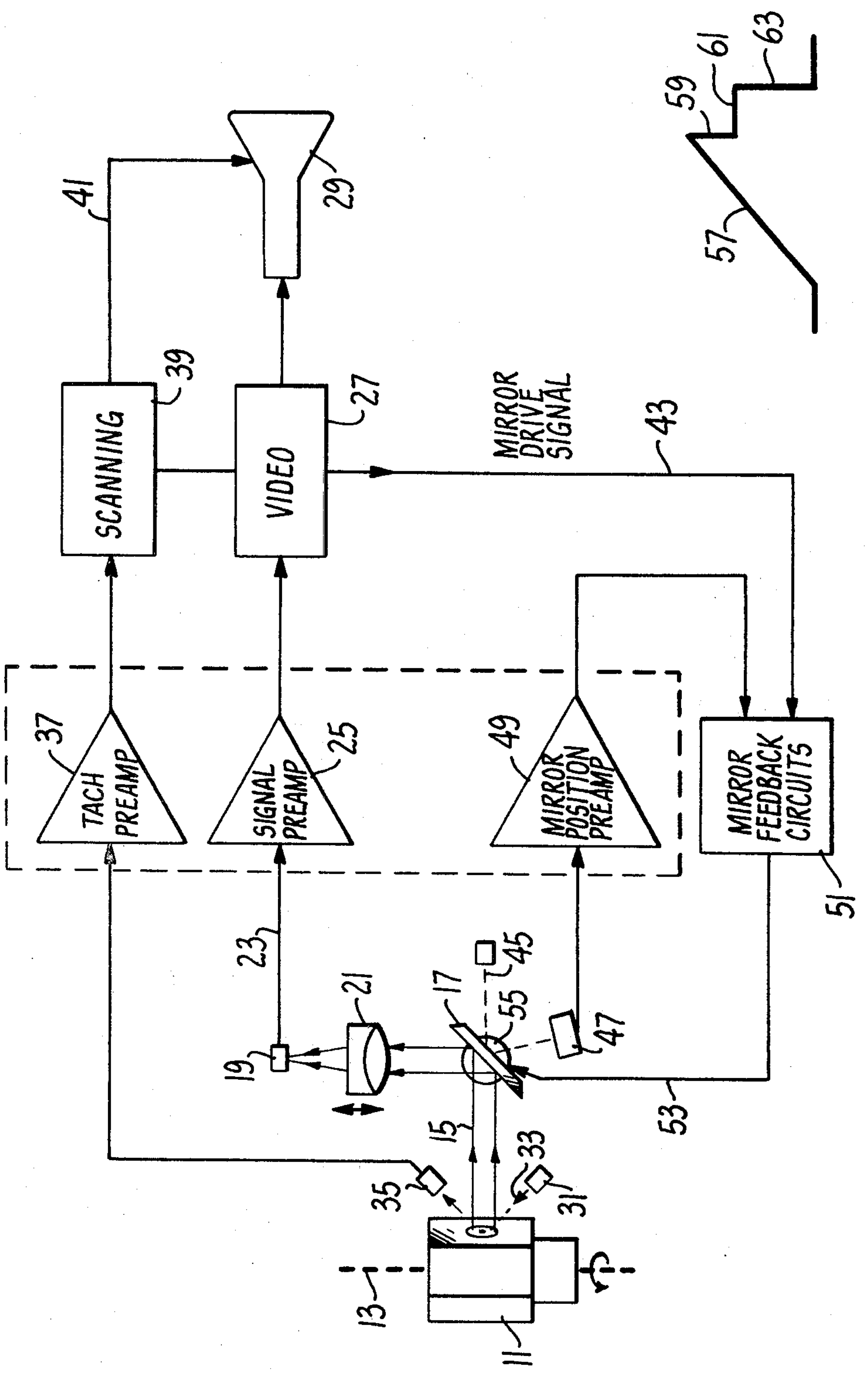
FIG. 1 illustrates in block diagram form one system in which the techniques of the present invention may be utilized.
FIG. 1A shows an example of a driving function for a mechanical element.

Referring to FIG. 1, a polygon mirror 11, shown to have six sides, is rotated about an axis 13 with which each of the mirrors is made to be accurately parallel. The motor which drives the polygon mirror 11 at a uniform angular velocity is preferably housed within the mirror assembly itself that is preferably made of a metal which shields the rest of the instrument from unwanted radiation. Light from an object field being imaged (traveling into the paper of FIG. 1) is reflected off of each of the mirrors one at a time as they are rotated. An object modified light beam 15 is reflected thereby onto an angularly rotatable mirror 17. The object modified light beam 15 is reflected by the mirror 17 onto an appropriate photo-detector 19. A lens assembly 21 is disposed in the object modified light beam and is made adjustable to focus an image of the desired object field onto the photo detector 19.

The photo-detector 19 is a substantial point and the two-dimensional object image is then scanned by the mirror assembly 11 and the mirror 17 over the point detector 19 is two dimensions. The polygon mirror assembly 11 scans a horizontal aspect of the object field across the detector 19 while the angular rocking mirror 17 scans the vertical aspect of the object image across the detector 19. In this way, a time varying electrical signal is generated at the output of the photo-detector 19 and in the line 23 which contains information of the object image. The signal in the line 23 is initially amplified by a preamplifier 25 and then is fed into a video processing circuit 27. The output of the video processing circuit 27 drives a cathode ray tube 29 which then converts the time varying electrical signals back into a two-dimensional image of the object being scanned.

In order for the image presented on the cathode ray tube 29 not to be distorted, the electron beam thereof must be scanned in the same pattern as the image is scanned across the detector 19. This synchronism is accomplished in the horizontal direction by a light source 31, such as a light emitting diode, which directs a beam of light 33 against the rotating polygon mirror assembly 11. The reflected light therefrom is detected by a photo-detector 35. A signal generated by the photo-detector 35 is amplified by a preamplifier 37. The output of the preamplifier 37 is thus a series of pulses, one pulse each time the rotating polygon mirror 11 has a mirror surface in a predetermined reference position wherein the reflected portion of the light beam 33 falls on the narrow photo-detector 35. This output of the preamplifier 37 controls a scanning circuit 39 which includes synchronous logic and horizontal and vertical scanning oscillators. The outputs of these oscillators are fed through a line 41 to the deflection coils of the cathode ray tube 29 for controlling the path of the electron beam.

The image is scanned in a vertical direction across the detector 19 in accordance with a mirror drive signal in a line 43 which is in synchronism with the vertical oscillator output of the scanning circuit 39 that is delivered through the line 41 to the cathode ray tube 29. In order to avoid distortion of the image displayed on the cathode ray tube 29, it is important, therefore, that the mirror 17 be scanned in a very accurate manner in accordance with the output of the vertical oscillator. This is accomplished by the use of a feedback network wherein the angular position of the mirror 17 is detected by reflecting a light beam 45 from its backside and onto a linear photo-detector 47. The output of the photo detector 47 is amplified by a preamplifier 49 and the output of the preamplifier 49 is fed through a feedback circuit 51 and a line 53 to a torque motor 55 which controls the angular position of the mirror 17. The position signal at the output of the preamplifier 49 is compared in the feedback circuit 51 with the desired motion signal in the line 43 that is developed from the vertical scanning oscillator. The practical range of rotation of the mirror 17 with this particular method of detection is about 90° or less. A maximum angle of 15° rotation is a typical one for a thermograph as illustrated.

The type of system shown in FIG. 1 has a primary use where electromagnetic light energy being detected by the detector 19 is in the invisible and near visible regions. The system thus serves to translate electromagnetic energy from without the visible spectrum into a visible display on the face of the cathode ray tube 29. An example of such electromagnetic energy is infrared radiation. One use of such a system is for medical diagnostic work wherein an image of a human patient displays the patient's temperature. The detector 19 for an infrared thermograph is preferably a mercury-cadmium-telluride detector which changes resistance in response to infrared radiation intensity.

An example of a mirror drive voltage signal in the line 45 is shown in FIG. 1A. This signal example includes a rising slope 57, a sharp decline 59, a level portion 61 and another sharp decline 63 to complete a voltage cycle of the mirror drive signal 43. A feedback circuit is desired to assure that the mirror 17 follows as accurately as possible this rather complicated voltage waveform in scanning out a single picture frame.

Figures 2, 3:
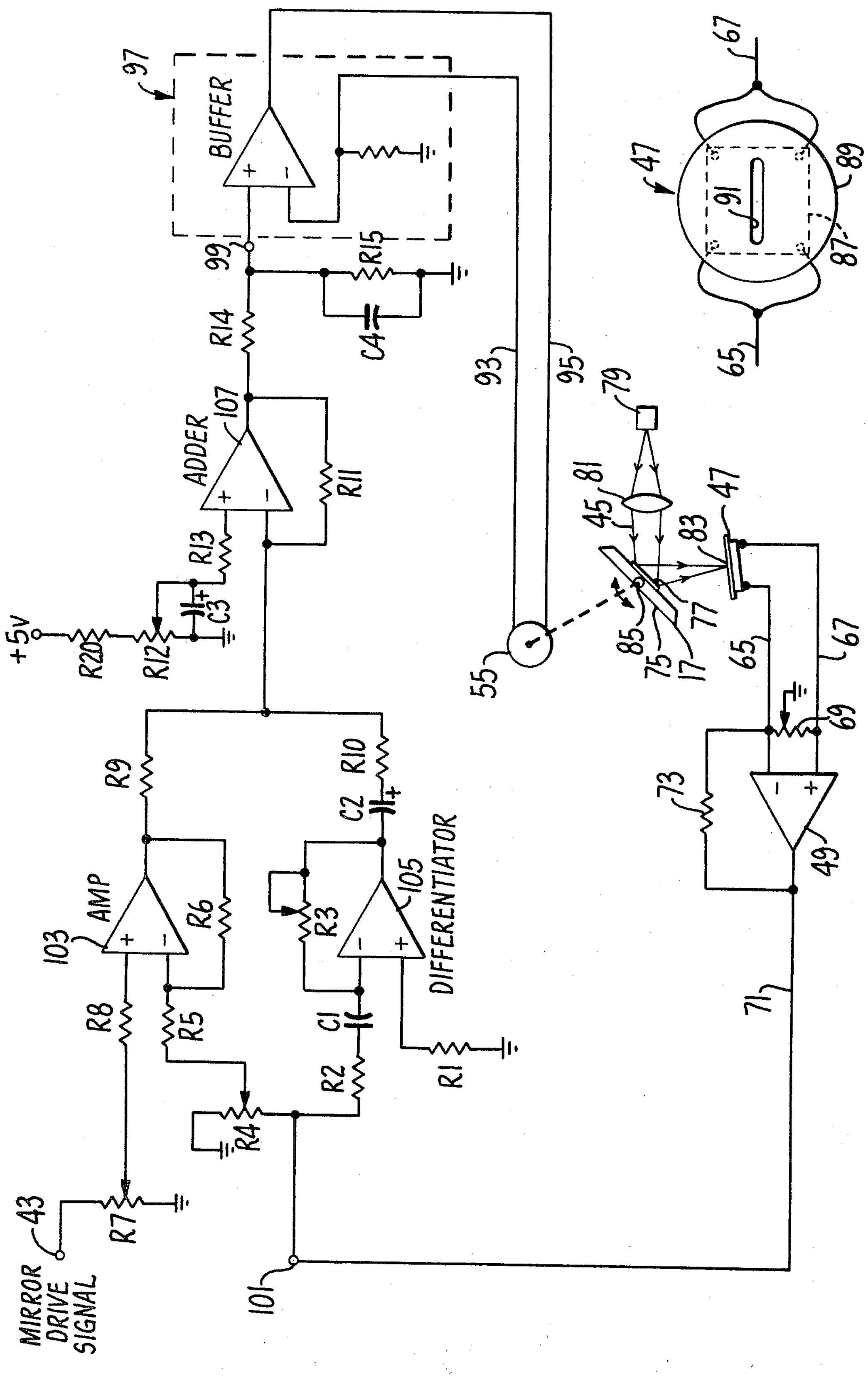
FIG. 2 is a circuit diagram of a portion of the system of FIG. 1.
FIG. 3 shows an optical detector utilized in the circuit diagram of FIG. 2.

Referring to FIG. 2, a preferred feedback circuit 51 of FIG. 1 for controlling the motion of the mirror 17 is shown in some detail. The electrical output of the detector 47 is provided in lines 65 and 67 connected with the inverting and non-inverting inputs, respectively, of an operational amplifier, which is the preamplifier 49. A variable resistance 69 is connected across the inputs of the amplifier 49 with its adjustable terminal connected to ground in order to make possible the balancing of the preamplifier input lines to ground. An output line 71 of the amplifier 49 is connected through a feedback resistance 73 to its inverting input. The voltage in the output line 71 is desired to be linearly related to the angular position of the mirror 17.

One side 75 of the mirror 17 is the side used for scanning the object field across the detector 19 as described with respect to FIG. 1. On the opposite side of the mirror 17 is smaller reflective area 77 for reflecting a detecting light beam 79 onto the photo-detector 47. The light beam 45 is generated by a convenient light source 79, such as a light emitting diode, and is controlled by a lens 81 so that it comes to a substantial point focus 83 on the photosensitive surface of the detector 47. As the mirror 17 is rotated in both directions about its axis 85 by the torque motor 55, the substantial point light beam 83 will travel back and forth across the photodetector 47. Since the voltage output in the lines 65 and 67 of the detector 47 is proportional linearly to the position of the light point 83 thereacross, its output signal is thus linearly proportional to the angular position of the mirror 17. The output 71 of the preamplifier 49 is thus also linearly related to the angular position of the mirror 17. The mirror 77 is made as small as possible yet remains large enough to intercept and reflect at all times the sensing light beam 45 onto the detector 47 in all anticipated angular positions of the mirror 17. The small size of the mirror 77 is desired in order to minimize the possibility that spurious light radiation may be reflected onto the photo-detector 47 and thus to cause an error in its output signal.

Referring to FIG. 3, the preferred detector 47 is shown in plan view wherein a two-dimensional photosensitive semiconductor material 87 is covered with an opaque mask 89 to leave a substantially one-dimensional line slit 91 through which the substantially point focused light 83 is scanned back and forth therealong upon rocking of the mirror 17. Each of the four corners of the detector material 87 is provided with an external electrical wire. The two contact points at one end of the slit 91 are connected together and to the output line 65 while the remaining two contact points at the opposite end of the slit 91 are connected together to the output line 67. The mask 89 with its narrow slit 91 limits the exposed photodetector area to that required to perform the desired function in order to minimize the possibility that undesired light may affect its output signal.

The mirror driving torque motor 55 is of a type that can drive the mirror 17 in both angular directions upon receipt of different polarity direct current in its supply lines 93 and 95. The required current with the proper polarity is supplied by a buffer amplifier 97 in response to a signal at a point 99. The signal at the point 99 at any instant is an error signal between the actual position of the mirror 17 and its desired position as embodied in the mirror drive input signal in the line 43. The buffer amplifier 97 drives the torque motor 55 in a direction which moves the mirror 17 to eliminate the error voltage at the point 99. A preferred buffer amplifier circuit is described hereinafter with respect to FIG. 4.

That portion of the circuit of FIG. 2 between a point 101 in the feedback signal line 77 and the point 99 compares the signal in the line 71 with the desired mirror position signal at the point 43. This portion of the circuit also provides damping of the mirror assembly 17 by electronic means. The feedback signal at the point 101 is passed directly to the point 99 by an operational amplifier 103 upon connection with its inverting input through appropriate input resistors R4 and R5. The non-inverting input of the amplifier 103 is connected with the mirror drive signal input 43 through appropriate input resistors R7 and R8. The feedback signal at the point 101 is differentiated by an operational amplifier 105 by connection thereof to its inverting input through a series arrangement of a capacitor C1 and a resistor R2. The output of the amplifier 105 is a signal that is the differential of the feedback signal at the point 101. The input resistor R2 is used in series with the differentiating capacitor C1 in order to serve as an upper limit on the output voltage to which the amplifier 105 is driven. A feedback resistor $R_3$ between the output of the amplifier 105 and its inverting input is made adjustable in order to vary the damping that is being electronically introduced in the driving motion of the mirror 17. The circuits are preferably adjusted for critical damping of the mirror 17.

The outputs of the amplifiers 103 and 105 are combined at an inverting input of an operational amplifier 107. An adjustable direct current voltage is applied to the non-inverting input of the amplifier 107 in order to provide an offset signal to the torque motor 55. The output of the summing operational amplifier 107, through a series resistance R14, becomes the signal at the point 99 which is used to drive the torque motor 55.

Figure 4:
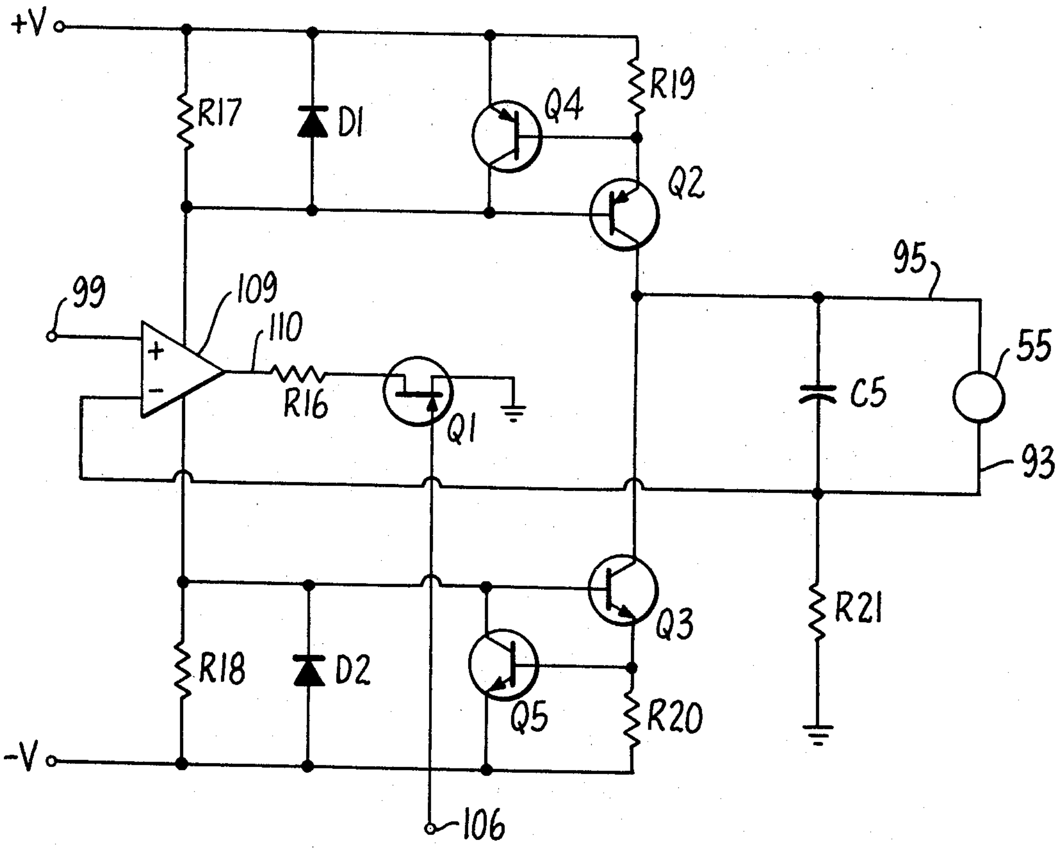
FIG. 4 shows additional detailed circuit diagrams of the feedback circuit of FIG. 2.

Specific values of components shown in FIG. 2 may be, as an example, the following:

Amplifiers 49, 103, 105 and 107 — 741 type, each
R1 — 47 k
R2 — 15k
R3 — 50k
R4 — 1k
R5 — 470 ohms
R6 — 2.2k
R7 — 1k
R8 — 470 ohms
R9 — 3.3k
R10 — 3.3k
R11 — 22k
R12, R13, R14, R15, R30 — 1k each
C1 — 0.1$\mu$f
C2 — 47$\mu$f
C3 — 15$\mu$f
C4 — 0.1$\mu$f
Torque Motor 55 — T4-150 available from Mechanics for Electronics
Position Detector 47 — A linear photo-detector, part No. SC/10 of United Detector Technology The preferred buffer amplifier 97 which drives the torque motor 55 is shown in FIG. 4. The error signal at the point 99 is connected with the non-inverting input of an operational amplifier 109. A feedback signal is connected to the inverting input of the amplifier 109 in the form of the line 93 from the torque motor 55. A current for driving the torque motor 55 is provided through a line 95 from the amplifier 109. A feedback resistor R21 is connected between the line 93 at one side of the torque motor 55 and ground potential. It is the current through the resistor R21 that develops a voltage drop thereacross that is equal at all times to the voltage difference between the inverting and the non-inverting inputs of the amplifier 109. About 0.30 amperes of current is supplied to the torque motor 55 per volt applied to the non-inverting input of the operational amplifier 109, for the particular R21 value described herein.

Current is supplied to the torque motor 55 from a push-pull circuit that includes transistors Q2 and Q3 operating as calss B amplifiers. The collectors of the transistors Q2 and Q3 are connected through the line 95 to one side of the torque motor 55 and supplies current thereto. The emitter of the transistor Q2 is connected to the +V voltage supply through a resistor R19. The emitter of the transistor Q3 is connected to the −V voltage supply through a resistor R20. For the specific circuit components described hereinafter, as an example, the +V voltage is equal to +10 volts and the −V voltage is equal to −10 volts.

The operational amplifier 109 is also supplied from the +V and −V voltage terminals through resistors R17 and R18, respectively. Instead of driving the torque motor 55 (or the transistors Q2 and Q3) from an output 110 of the operational amplifier 109, the output 110 is normally connected to ground potential through a series combination of resistor R16 and FET device Q1. Since the operational amplifier 109 will draw current through its voltage supply resistors R17 and R18 only when current is demanded of it at its output 110, the voltage drop across the resistors R17 and R18 may be utilized as the output signal of the amplifier 109 rather than using the output 110 directly. Therefore, it is the voltage drops across the resistors R17 and R18 in the voltage supply lines to the amplifier 109 that are used to drive the amplifying transistors Q2 and Q3 by connecting their bases to the amplifier side of the resistors R17 and R18, respectively. With Q1 in an "on" state providing a low resistance path of the output 110 to ground, the varying voltage at the input point 99 will be followed by a varying voltage across either the resistor R17 or the resistor R18, depending upon whether the voltage at 99 is positive or negative. When the input voltage at the point 99 is positive, a current flows through Q2, the torque motor 55 and the resistor R21 to ground. When the voltage at the point 99 is negative, the current flows from ground through the resistor R21, the torque motor 55, and through the transistor Q3.

Diodes D1 and D2 are connected across the voltage supply resistors R17 and R18, respectively, for protection of the various semiconductor devices against inductive voltage transients. Transistors Q4 and Q5 connected with their collectors and emitters across the resistors R17 and R18, respectively, serve to limit the current supplied to the torque motor 55. The bases of the transistors Q4 and Q5 are connected with the emitters of transistors Q2 and Q3, respectively. Too much current to the torque motor 55 may demagnetize it.

Instead of connecting the output 110 of the amplifier 109 directly to ground through the resistor R16, the transistor Q1 is provided as a means for turning off load current to the torque motor 55. When Q1 is turned off (high resistance state), no current will flow through the output 110 of the amplifier 109 and thus little or no current will flow through the resistors R17 and R18 to the amplifier 109 from the supply voltage terminals Q1 may be turned off by applying a sufficient negative voltage to its gate at the circuit terminal 106. When Q1 is turned off, the mirror 17 of FIG. 2 will not operate in response to the input driving signal at the terminal 43. Thus, the entire circuit may be turned on or off by controlling the voltage at the gate of the FET device Q1. This may be by manual means or by automatic circuits.

In the application of the various aspects of the present invention to a system of scanning an image over a detector as shown in FIG. 1, it will be recognized that it takes a short time for the polygon mirror 11 to reach its driving speed once the power is first turned on to the system. While the rotating polygon mirror 11 is coming up to speed, the mirror 17 will have a tendency to act erratically and hit hard against its mechanical stops, particularly due to power supply turn on transients. Therefore, it is desirable to disconnect the driving circuit to the vertical scanning mirror 17 during the first few seconds that power is applied to the system of FIG. 1. A circuit for accomplishing this delay is shown in detail in FIG. 5 and is used in conjunction with the controlling FET device Q1 of FIG. 4 to keep power off to the torque motor 55 driving the mirror 17 for the first few seconds that power is turned onto the system. Of course, the voltage of the gate of Q1 may be manually controlled by applying an appropriate voltage to the terminal 106 to turn the current to the torque motor 55 on and off, but the circuit of FIG. 5 is preferred since it accomplishes the desired switching automatically without necessity for separate action by an operator using a scanning system of the type shown in FIG. 1.

Figure 5:
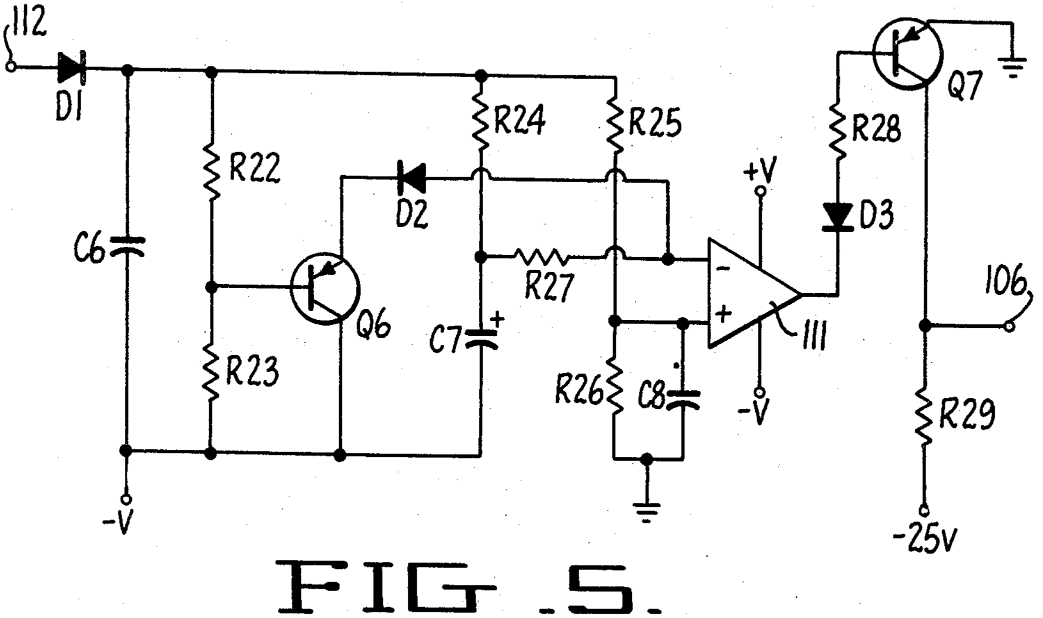
FIG. 5 is a circuit diagram of an electronic switch for use with the circuit of FIG. 4.

Referring to FIG. 5, a terminal 112 is connected to the power supply of a scanning system and thus immediately rises to a maximum AC voltage when power to the system is first turned on. The voltage at the terminal 112 will subsequently drop to zero immediately upon the power to the system being turned off. For the specific circuit components shown in FIG. 5, this voltage is about 21 volts A.C. which is connected to a diode D1 to rectify it into a direct current. A capacitor C6 and series resistors R22 and R23 are connected between this direct voltage point (which rises and falls as power is turned on and off to the system) and to a direct current power supply source −V, which in the case of the circuit of FIG. 5 is a −10 volts. A series circuit of a resistor R24 and a capacitor C7 is also connected between these direct current potentials. When power is first turned on to the system, a voltage is immediately impressed across the series combination of R24 and C7 which causes the voltage across the capacitor C7 to build up at a rate dependent upon the time constant fixed by the values of R24 and C7. The voltage across the capacitor C7 is communicated with an inverting input of an operational amplifier 111 through a resistor R27. When the voltage across the capacitor C7 exceeds that bias voltage applied to the non-inverting input of the amplifier 111 by a bridge of resistors R25, the output of the amplifier 111 is rapidly switched negative from its positive output state.

The output of the amplifier 111 is connected through a series combination of a diode D3 and a resistor R28 to the base of transistor Q7. The collector of the transistor Q7 is connected through a series resistance R29 to a negative direct current voltage supply, in this particular case a magnitude of −25 volts. The collector of the transistor Q7 also supplies the desired output signal to the terminal 106 which drives the FET device Q1 of FIG. 4.

When the voltage level at the point 112 of FIG. 5 first rises in response to the power being applied to a system in which the circuit is being used, the output of the amplifier 111 will be positive since the voltage applied to its non-inverting input will be greater than the voltage applied to its inverting input. The capacitor C7 is being charged through the resistor R24 and at some point when the voltage across the capacitor C7 exceeds that applied to the non-inverting input of the amplifier 111, the output of the amplifier 111 will switch to a negative value. When the power is first established to the system, the transistor Q7 is in its off state, the diode D3 is backed biased and the output at the terminal 106 is a −25 volts. This −25 volts as applied to the gate of the FET device Q1 of FIG. 4 will maintain it in an off state.

After the capacitor C7 has charged, however, and the output of the amplifier 111 has switched negative, the transistor Q7 is turned on and the output at the terminal 106 is substantially zero. The FET device Q1 of FIG. 4 is then turned on, which in turn turns on load current to the torque drive motor 55.

When system power is shut off, it is desirable that voltage at the output point 106 of the circuit of FIG. 5 rapidly change to the negative voltage level which turns off the transistor Q1 of FIG. 4. This is accomplished by rapidly discharging the capacitor C7 when an interruption in supply power is sensed at the point 112. This is accomplished by providing a discharge path across the capacitor C7 including the resistor R27, a diode D2 and a transistor Q6. The discharging resistance R27 is made considerably smaller in value than the charging resistance R24 so that the time constant on discharge is many times smaller than the time constant on charging the capacitor C7. When power at the point 112 of FIG. 5 is interrupted, the base of the transistor Q6 is effectively connected to its collector which then turns the transistor Q6 on heavily and forms a low resistance discharge path across the capacitor C7. This causes the output of the amplifier 111 to rapidly switch which turns transistor Q7 off and thus causes the output point 106 to go negative.

Specific values of components shown in FIG. 4 may be, as an example, the following:

Amplifier 109 – 741 type
R16 – 470 ohms
R17, R18 – 220 ohms
R19, R20, R21 – 3.3 ohms
C5 – 0.47 $\mu$f
Q1 – 2N5653
Q2 – 2N5195
Q3 – 2N5192
Q4 – 2N4403
Q5 – 2N4401
D1, D2 – 1N914 each Specific values of components shown in FIG. 5 may be, as an example, the following:

Amplifier 111 – 741 type
R22 – 3.3k
R23 – 3.9k
R24 – 220k
R25 – 4.7M
R26 – 1M
R27 – 100 ohms
R28 – 10k
C6 – 6.8$\mu$f
C7 – 47$\mu$f
C8 – 0.1$\mu$f
Q6, Q7 – 2N4403 each
D1 – 20A2
D2, D3 – 1N914

The various aspects of the present invention have been described with respect to specific preferred embodiments thereof, but it will be understood that the invention is defined by the appended claims.

I claim:

1. An electronic circuit for controllably supplying current to a load, comprising:

an amplifier having an input, an output and at least one power supply line, a switching element connected in the output line of said amplifier for connecting said output line to a fixed potential, whereby current flowing in said at least one power supply line varies in proportion to a signal at the amplifier input when the switching element is turned on while substantially no current flows in said at least one power supply line when the switching element is turned off, and means for sensing current flow in the voltage supply line and driving said load with a current proportional thereto.

2. An optical scanning instrument, comprising a point radiation detector which generates a time varying electrical signal in proportion to the intensity of radiation incident thereon, a rotating mirror system for scanning the horizontal aspects of an object radiation field image across said point detector, said horizontal scanning system including a motor for driving said system at substantially a uniform angular velocity, an angularly rotatable mirror positioned to scan the vertical aspects of the object radiation field image across said detector, a torque motor for angularly rotating said vertical scanning mirror, an electronic circuit for synthesizing a voltage function for driving said torque motor, thereby to drive said vertical scanning mirror in accordance with said function, an amplifier having an input, an output and at least one power supply line, said amplifier input being connected to the voltage waveform synthesized by said electronic circuit, a switching element positioned in the output circuit of said amplifier for connecting its output to a fixed potential when the switching element is turned on and alternatively allowing the amplifier to float when the switching element is turned off, whereby current in said at least one power supply line to the amplifier varies in proportion to the vertical mirror driving signal at its input when the switching element is on and whereby current in said at least one power supply line is substantially zero when the switching element is turned to its off condition, and means for sensing current flow in said amplifier power supply line and for driving said torque motor in response thereto.

3. The optical scanning instrument according to claim 2 wherein the switching element includes;

means for sensing when electrical energy is first applied to the horizontal scanning rotating mirror assembly driving motor, means for holding the switching element in an off state for a period of time at least as great as that required for the horizontal scanning assembly driving motor to bring the horizontal scanning assembly up to its substantially uniform angular velocity and for switching the switching element to its on state after said period of time, whereby the vertical scanning mirror torque motor is energized by said amplifier means.

4. An electronic circuit for controllably supplying current to a two terminal load, comprising, an operational amplifier having an inverting input, a non-inverting input, an output, a positive voltage supply terminal and a negative voltage supply terminal, a resistor connected between the positive voltage amplifier supply terminal and a positive voltage source, a resistor connected between the negative voltage amplifier supply terminal and a negative voltage source, a switching element connected to the output of said operational amplifier for controllable connection thereof to a reference potential, means sensing a voltage drop across at least one of said positive voltage circuit or negative voltage circuit resistors for supplying current to one terminal of said load that is proportional to the voltage sensed, a resistance connected between a fixed potential and the other terminal of said load, said other terminal of the load also being connected to the inverting input of said amplifier, whereby a load current proportional to voltage at the non-inverting amplifier input is supplied to said load and whereby the switching element in the amplifier output circuit will shut off current to the load.

5. An electronic circuit according to claim 4 wherein the switching element includes a three terminal semiconductor device having a control terminal whose voltage determines whether the switching element is in its on state or in its off state.

6. An electronic circuit according to claim 5 additionally comprising an electronic circuit connected to the control terminal of the semiconductor switching element for controlling whether said switch is in its on state or its off state, said circuit including:

means for turning on said semiconductor switch after a predetermined delay from the time that a change in a voltage from a first level to a second level is sensed, and means for turning the semiconductor switching device into its off state substantially instantaneously with detection of a change in said voltage level from its second level back to its first level.

7. An electronic switching circuit for changing an output between two electrical levels in response to an external voltage changing between high and low levels, comprising:

a capacitor normally connected to be charged to a voltage proportional to the external voltage level through a series charging resistance, means sensing the voltage across the capacitor for driving said circuit output to one level when the voltage is below a certain threshold and to a second output level when the capacitor voltage is equal to or greater than said threshold voltage level, and means for connecting a discharge resistance across said capacitor when the external voltage is at a low level, said discharge resistance having a value significantly less than said series charging resistance.

8. An electronic circuit for controllably supplying current to a load, comprising:

an amplifier having an input, an output and at least one power supply line, a signal source connected to said amplifier input, a power supply connected to said at least one power supply line, a fixed potential terminal, a switching element connected between the amplifier output and said fixed potential terminal, said switching element having conductive and non-conductive states in response to a control signal, means independent of the amplifier input signal level for developing said control signal, and means for sensing current flow in the voltage supply line and driving said load with a current proportional thereto, whereby current to said load is turned off when said control signal causes the switching element to go into its non-conductive state.

9. The electronic circuit of claim 8 wherein said control signal developing means includes means responsive to a power supply level to said signal source for holding the switching element in its non-conductive state for a period of time after power is first applied to the signal source, whereby the load does not receive current during a warm-up period of said signal source.

10. The electronic circuit of claim 9 wherein said control signal developing means additionally includes means responsive to said power supply level of the signal source for rapidly causing the switching element to become non-conductive after power is first removed from the signal source, whereby the load does not receive current during transients within the signal source that may follow removal of power therefrom.

* * * * *